US011025268B1

(12) United States Patent
Wang et al.

(10) Patent No.: US 11,025,268 B1
(45) Date of Patent: Jun. 1, 2021

(54) ENCODING AND DECODING METHOD FOR OPTICAL ISOLATION AMPLIFIER EMPLOYING SIGMA-DELTA MODULATION TECHNOLOGY

(71) Applicant: LITE-ON SINGAPORE PTE. LTD., Singapore (SG)

(72) Inventors: You-Fa Wang, Singapore (SG); Yu-wei Wang, Singapore (SG); Meng-Tong Tan, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/084,939

(22) Filed: Oct. 30, 2020

(51) Int. Cl.
*H03M 3/00* (2006.01)
*H03M 1/12* (2006.01)
*H03M 1/00* (2006.01)
*G02F 7/00* (2006.01)

(52) U.S. Cl.
CPC ............... *H03M 3/30* (2013.01); *G02F 7/00* (2013.01); *H03M 1/001* (2013.01); *H03M 1/12* (2013.01)

(58) Field of Classification Search
CPC .......... H03M 3/30; H03M 1/001; H03M 1/12; G02F 7/00

USPC ................. 341/143, 110, 137, 155
See application file for complete search history.

(56) References Cited

U.S. PATENT DOCUMENTS 5,287,107 A * 2/1994 Gampell ............... H03M 3/368
341/110

\* cited by examiner

*Primary Examiner* — Joseph J Lauture
(74) *Attorney, Agent, or Firm* — Li & Cai Intellectual Property (USA) Office (57) ABSTRACT

An encoding and decoding method for an optical isolation amplifier including an encoder, an optical driver, a light source, an optical detector, and a decoder, and employing sigma-delta modulation technology is provided. The method includes: generating a plurality of first pulses, each having a predetermined pulse width, through the encoder when an input digital signal experiences an input pulse rising or falling edge; outputting an encoded signal having the plurality of first pulses to the optical driver; driving the light source through the optical driver, according to the plurality of first pulses, so as to output an encoded optical signal; generating a detected signal through the optical detector detecting the encoded optical signal, and the detected signal has a plurality of second pulses; and duplicating the input digital signal of the encoder through the decoder, according to the detected signal having the plurality of second pulses.

9 Claims, 7 Drawing Sheets

ENCODING AND DECODING METHOD FOR OPTICAL ISOLATION AMPLIFIER EMPLOYING SIGMA-DELTA MODULATION TECHNOLOGY

FIELD OF THE DISCLOSURE

The present disclosure relates to an optical isolation amplifier employing a sigma-delta (Σ-Δ) modulation technology, and more particularly to an encoding and decoding method for the optical isolation amplifier, which can accurately restore a one-bit data stream generated by a sigma-delta modulator after passing through an optical channel.

BACKGROUND OF THE DISCLOSURE

An optical coupler is a circuit element that transmits electrical signals through light. The optical coupler element has a function of providing an electrical isolation between an input circuit and an output circuit, thereby enabling the electrical signals to be transmitted through an electrical isolating layer.

Figure 1:
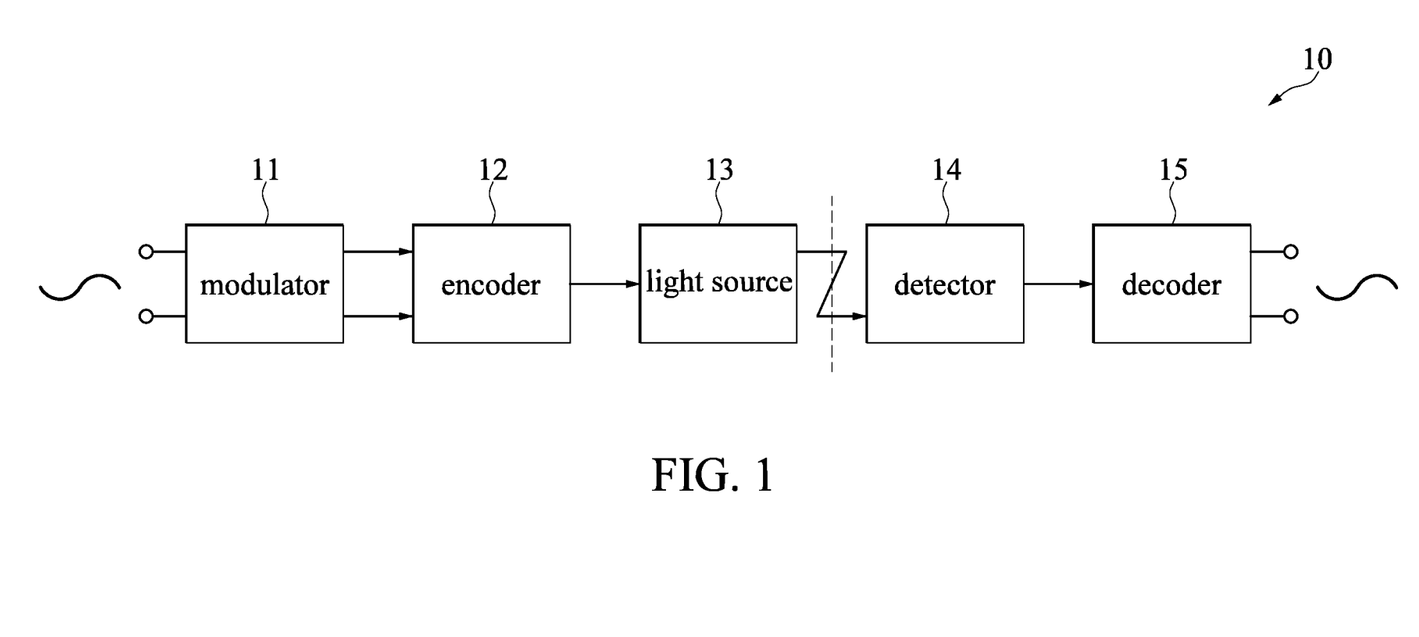
FIG. 1 is a block diagram showing a circuit of a conventional optical isolation amplifier employing a sigma-delta ($\Sigma$-$\Delta$) modulation technology.

Reference is made to FIG. 1, which is a block diagram showing a circuit of a conventional optical isolation amplifier employing a sigma-delta (Σ-Δ) modulation technology. An analog input signal is converted into a high speed serial one-bit data stream through a Σ-Δ modulator. The one-bit data stream is composed of logic levels "1" and logic levels "0", and a density of the logic levels "1" in the one-bit stream is proportional to an amplitude of the input analog signal. The one-bit data stream is encoded by an encoder, the encoded one-bit data stream then drives a light source, so as to convert an encoded data signal of the encoded one-bit data stream into an optical signal, the optical signal is then converted into a data stream through the optical detecting and amplifying circuit, the data stream is converted back into the one-bit data stream, and then the one-bit data stream is converted into an analog signal through a digital-to-analog converter. Since the amplitude of the analog signal is proportional to the density of the logic levels "1" in the one-bit stream, accurately restoring the one-bit stream through the decoder has become a crucial matter when designing an optical isolation amplifier. As shown in FIG. 1, the conventional optical isolation amplifier 10 employing the Σ-Δ modulation technology includes a modulator 11, an encoder 12, a light source 13, an optical detector 14, and a decoder 15. The modulator 11 is an analog modulator, which can convert the input analog signal into a one-bit digital signal. The encoder 12 is electrically connected to the modulator 11, and the encoder 12 receives and encodes the digital signal. The light source 13 is electrically connected to the encoder 12, the light source 13 receives the encoded digital signal, and the light source 13 is driven by the encoded digital signal to output an optical signal. The optical detector 14 senses the optical signal and converts the optical signal into another digital signal. The decoder 15 is electrically connected to the optical detector 14, and the decoder 15 receives and decodes the another digital signal, so as to output another analog signal.

Figure 2:
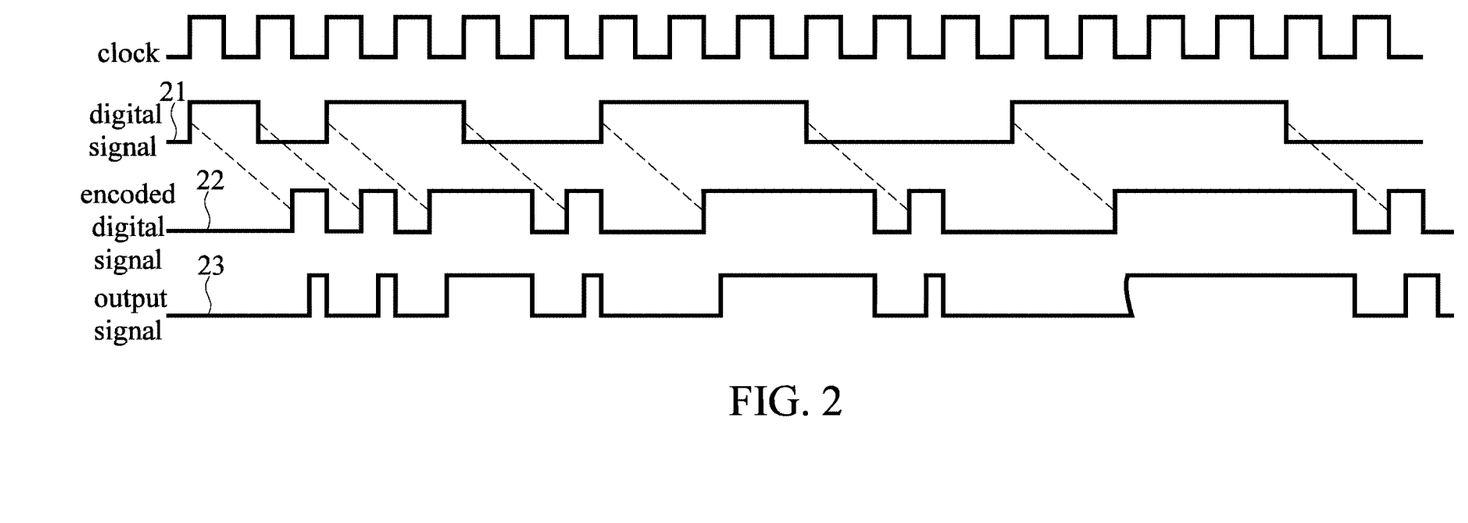
FIG. 2 is a waveform diagram showing a waveform of the conventional optical isolation amplifier employing the $\Sigma$-$\Delta$ modulation technology.

However, in the conventional optical isolation amplifier 10 employing the Σ-Δ modulation technology, the input analog signal is converted by the Σ-Δ modulator into a high speed serial one-bit data stream that is a high speed data stream in which pulse distortion and changes of the rising edge and the falling edge occur, when the high speed data stream passes the optical channels in an optical isolation amplifier that include circuits such as optical drivers, light sources, optical detector, and transimpedance amplifiers. When employing the conventional encoding and decoding method, the one-bit data stream generated by the Σ-Δ modulator cannot be accurately restored. Reference is made to FIG. 2, which is a waveform diagram showing a waveform of the conventional optical isolation amplifier employing the Σ-Δ modulation technology. As shown in FIG. 2, a digital signal 21 of the modulator 11 is converted by the encoder 12 into an encoded digital signal 22. The encoded digital signal 22 outputted by the encoder 12 has a pulse width that is different from that of an output signal 23 of the decoder 15. That is to say, the density of the logic levels "1" of the one-bit data stream is changed, and after the signal in the one-bit data stream is decoded, passed through a digital-to-analog converter, and restored back to an analog signal, the changes of the one-bit data stream thereby lead to problems such as an increments of input offset voltage ($V_{os}$) of the optical isolation amplifier, a decreasing of the signal-to-noise ratio, and a degradation of linearity.

Moreover, different signal pulse widths have different distortion of signals, e.g., different rising edges, falling edges, and propagation delays, when the signals pass through the optical channels that include optical drivers and optical detector s. Therefore, a one-bit data stream obtained through the decoder is different from the one-bit data stream generated by the Σ-Δ modulator. The input analog signal is converted through the Σ-Δ modulator into the one-bit data stream, and the density of the logic levels "1" are proportional to the amplitude of the input analog signal. Therefore, distortion of the signals and the change of the rising edges and the falling edges leads to the change of the density of the logic levels "1" in the one-bit data stream after passing through the optical channels, which thereby leads to problems such as the increasing of input offset voltage ($V_{os}$) of the optical isolation amplifier, the decreasing of the signal-to-noise ratio, and the degradation of linearity of the optical isolation amplifier.

In conclusion, it has become an important to accurately restore the one-bit data stream generated by the Σ-Δ modulator in the optical isolation amplifier through circuit design, after the one-bit data stream passes through an optical channel.

SUMMARY OF THE DISCLOSURE

In response to the above-referenced technical inadequacies, the present disclosure provides an encoding and decoding method, which can accurately restore a one-bit data stream generated by a sigma-delta (Σ-Δ) modulator, after passing through an optical channel.

In one aspect, the present disclosure provides an encoding and decoding method for an optical isolation amplifier employing sigma-delta modulation technology. The optical isolation amplifier includes an encoder, an optical driver, a light source, an optical detector, and a decoder. The encoding and decoding method includes: the encoder generating a plurality of first pulses with a predetermined pulse width, when an input digital signal experiences an input pulse rising edge or an input pulse falling edge, and each of the predetermined pulse widths being between 10% and 25% of the pulse width of the clock pulse of the Σ-Δ modulator, so as to ensure that the plurality of first pulses effectively passes through the optical channel; outputting an encoded signal having the plurality of first pulses to the optical driver; driving the light source through the optical driver, according to the plurality of first pulses of the encoded signal, so as to output an encoded optical signal; generating a detected signal through the optical detector which detects the encoded optical signal, and the detected signal having a plurality of second pulses corresponding to the plurality of first pulses of the encoded signal; and duplicating the input digital signal of the encoder through the decoder, according to the detected signal having the plurality of second pulses.

One of the advantages of the method of the present disclosure is that the encoding and decoding method for the optical isolation amplifier employing a $\Sigma$-$\Delta$ modulation technology is able to increase an accuracy of the output signal of the optical isolation amplifier, decrease an input offset voltage ($V_{os}$) of the optical isolation amplifier, increase a signal-to-noise ratio, and improve a linearity of the optical isolation amplifier through the technical solution of adopting a dual-edge-triggered signal encoder and adopting a rising-edge-triggered signal decoder in the decoder.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
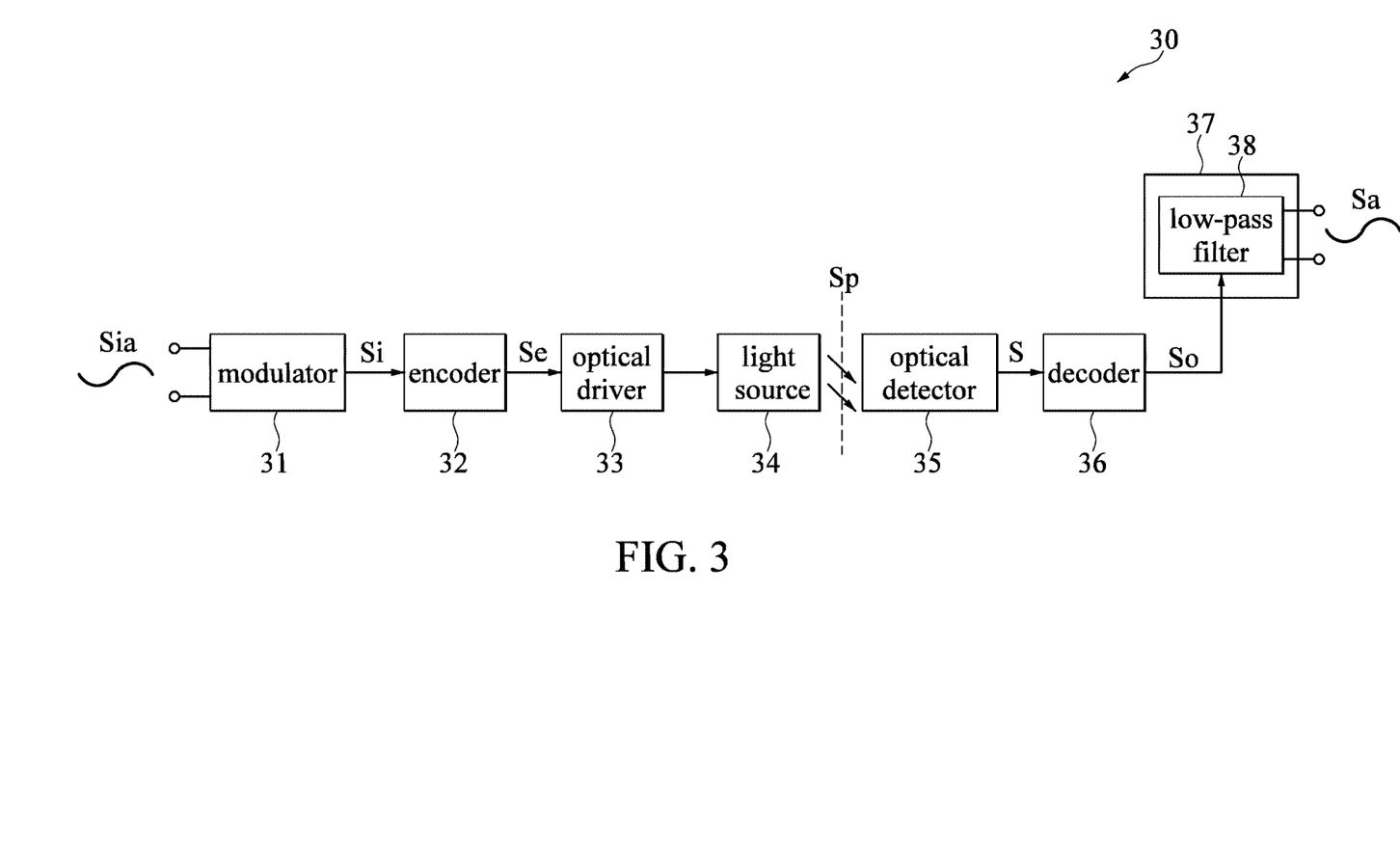
FIG. 3 is a block diagram of an optical isolation amplifier of the present disclosure.
Figure 4:
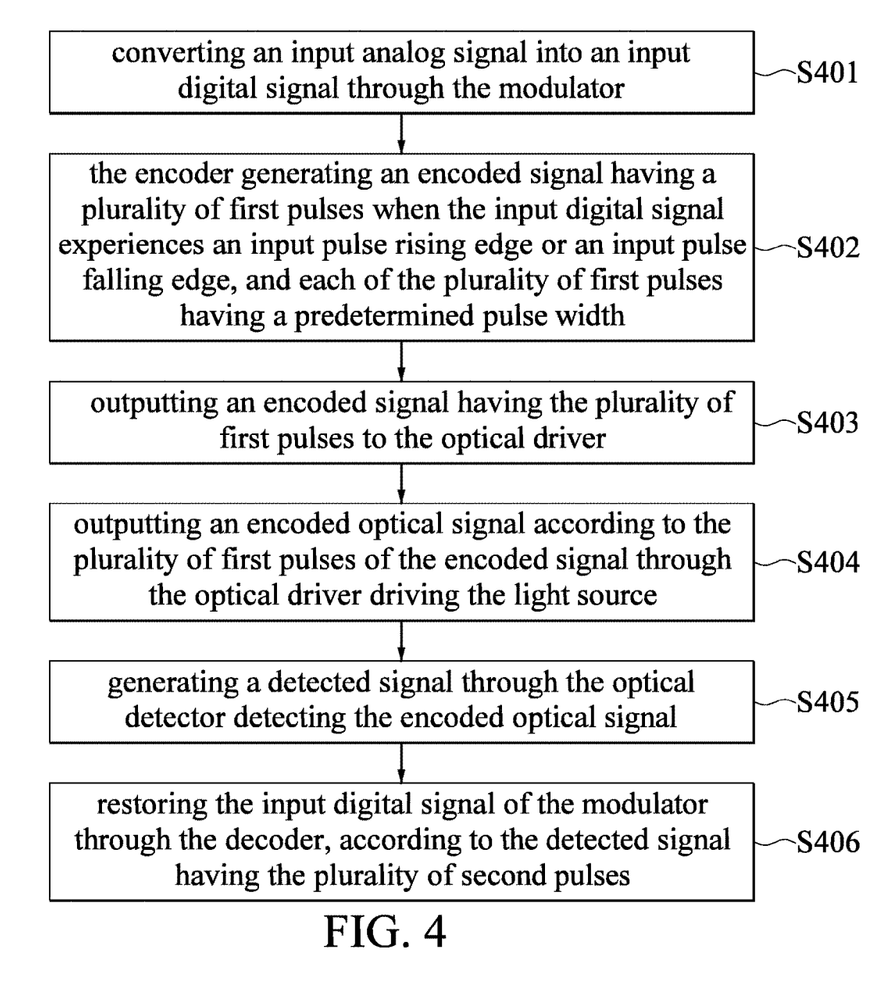
FIG. 4 is a flowchart of an encoding and decoding method of the optical isolation amplifier of the present disclosure.
Figure 5:
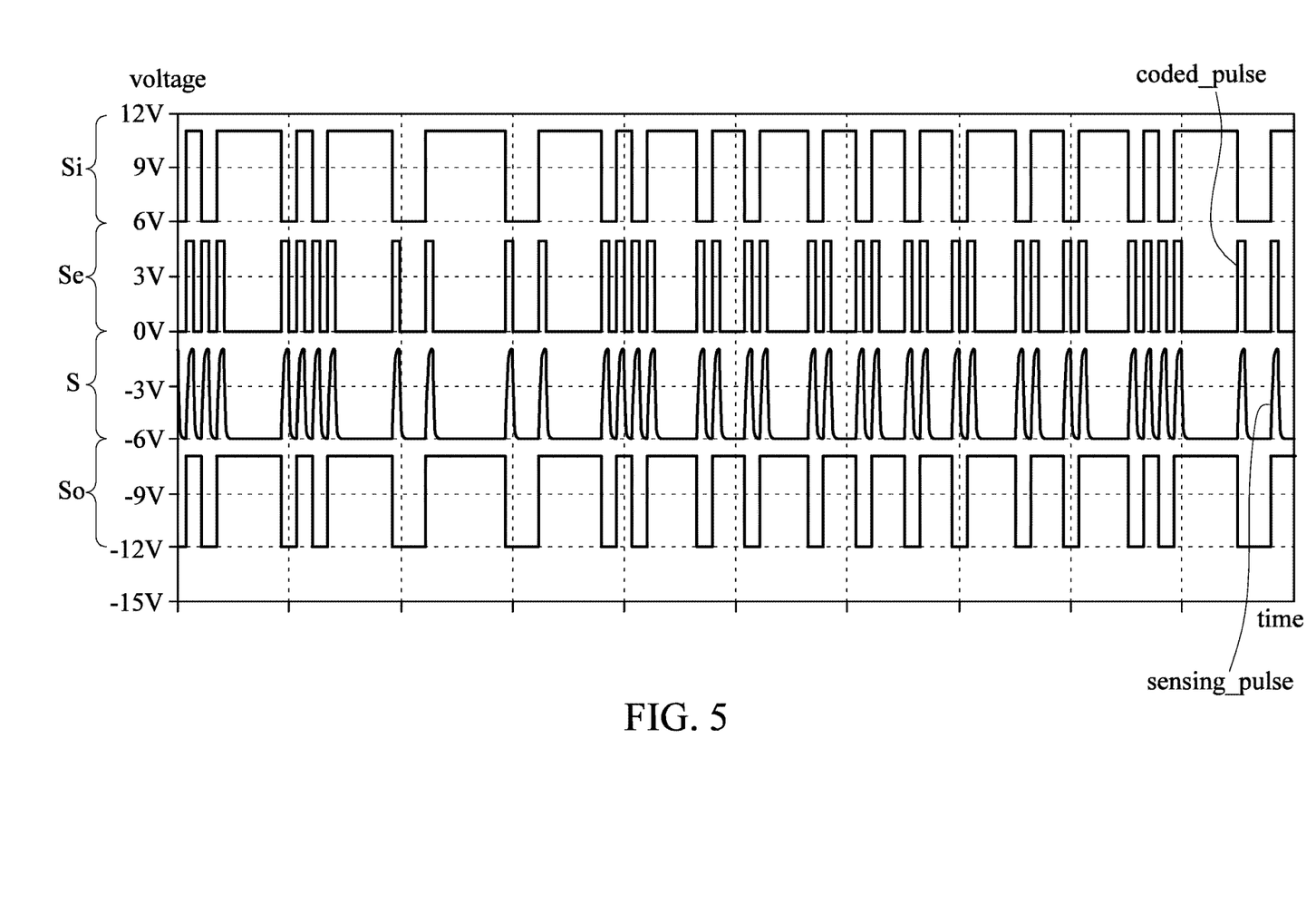
FIG. 5 is a waveform diagram showing a waveform of the optical isolation amplifier employing the $\Sigma$-$\Delta$ modulation technology of the present disclosure.

FIG. 3 is a block diagram of an optical isolation amplifier of the present disclosure. FIG. 4 is a flowchart of an encoding and decoding method of the optical isolation amplifier of the present disclosure. FIG. 5 is a waveform diagram showing a waveform of the optical isolation amplifier employing the sigma-delta ($\Sigma$-$\Delta$) modulation technology of the present disclosure. As shown in FIG. 3, an optical isolated amplifier 30 provided by the present disclosure at least includes: a modulator 31, an encoder 32, an optical driver 33, a light source 34, an optical detector 35, a decoder 36, a digital-to-analog converter 37, and a low-pass filter 38.

References are made to FIG. 3, FIG. 4, and FIG. 5. In step S401, an input analog signal Sia is converted into an input digital signal Si through the modulator 31. The modulator 31 is preferably an $\Sigma$-$\Delta$ modulator, i.e., a pulse density modulation (PDM) modulator. The $\Sigma$-$\Delta$ modulator is an analog-to-digital circuit, which can convert an analog signal into a digital signal, i.e., sampling the analog signal and converting the analog signal into a one-bit digital signal. Therefore, the $\Sigma$-$\Delta$ modulator has advantages of being able to shape noises, effectively suppressing quantization noises, and having a higher signal-to-noise ratio. The $\Sigma$-$\Delta$ modulation circuit, which is composed of an integrator and a differentiator, has a differentiating characteristic, such that the $\Sigma$-$\Delta$ modulator has a high-pass filtration effect on the quantization noises. The mechanism of the $\Sigma$-$\Delta$ modulator is known by a person having ordinary skill in the art, and will not be reiterated herein. In a preferable embodiment of the present disclosure, an input signal is the input analog signal Sia, the input analog signal Sia is transmitted to the modulator 31, and the modulator 31 then converts the input analog signal Sia into the one-bit input digital signal Si.

In step S402, when an input pulse rising edge or an input pulse falling edge is presented in the input digital signal Si, an encoded signal Se having a plurality of first pulses is generated by the encoder 32, and each of the plurality of first pulses has a predetermined pulse width. The encoder 32 is electrically connected to the modulator 31, and the encoder 32 can be utilized to encode the input digital signal Si that is transmitted from the modulator 31. Moreover, the encoder 32 is able to detect the input pulse rising edge and the input pulse falling edge of the input digital signal Si generated by the modulator 31, and the encoder 32 is able to generate the plurality of first pulses each having the predetermined pulse width, according to the input pulse rising edge and the input pulse falling edge of the input digital signal Si.

In step S403, an encoded signal Se having the plurality of first pulses is outputted to the optical driver 33. To be more specific, the encoder 32 is preferably a dual-edge-triggered signal encoder, the dual-edge-triggered signal encoder receives the input digital signal Si of the modulator 31, and according to the input digital signal Si of the modulator 31, when the input pulse rising edge or the input pulse falling edge of the input digital signal Si occurs, the dual-edgetriggered signal encoder generates the plurality of first pulses each having the predetermined pulse width. In other words, when the dual-edge-triggered signal encoder detects the input pulse rising edge or the input pulse falling edge of the input digital signal Si of the modulator 31, the dual-edge-triggered signal encoder then generates the plurality of first pulses. Each of the plurality of first pulses has the predetermined pulse width that is identical to one another, and the encoded signal Se includes the plurality of first pulses, each having the predetermined pulse width.

In step S404, the light source 34 is driven by the optical driver 33, so as to output an encoded optical signal Sp according to the plurality of first pulses of the encoded signal Se. The optical driver 33 is electrically connected to the encoder 32 and the light source 34, and the optical driver 33 receives the encoded signal Se having the plurality of first pulses that is outputted by the encoder 32. The optical driver 33 is able to drive the light source 34, so as to output the encoded optical signal Sp, according to the encoded signal Se having the plurality of first pulses. The light source 34 is preferably an LED, but in other embodiments, the light source 34 can also include different light emitters, and the present disclosure is not limited thereto. The optical driver 33 receives the encoded signal Se having the plurality of first pulses outputted from the encoder 32, so as to drive the light source 34 to emit light, thereby outputting the encoded optical signal Sp. In other words, the encoded optical signal Sp that is outputted by the light source 34 corresponds to the encoded signal Se.

Next, in step S405, a detected signal S is generated through the optical detector 35 detecting the encoded optical signal Sp, and the detected signal S has a plurality of second pulses corresponding to the plurality of first pulses of the encoded signal Se. After the optical driver 33 drives the light source 34 to generate the encoded optical signal Sp according to the encoded signal Se having the plurality of first pulses, the optical detector 35 senses the encoded optical signal Sp to generate the detected signal S having the plurality of second pulses that is distorted. As shown in FIG. 5, a distortion of each of the plurality of second pulses is related to the pulse width of each of the plurality of first pulses.

To be more specific, the optical detector 35 is disposed on a position relative to the light source 34, i.e., on a light transmission path of the light source 34, and the optical detector 35 is utilized to detect the encoded optical signal Sp outputted by the light source 34, so as to generate the detected signal S. The detected signal S generated by the optical detector 35 has the plurality of second pulses corresponding to the plurality of first pulses of the encoded signal Se, and a pulse width of each of the plurality of second pulses is related to a pulse width of each of the plurality of first pulses. The optical detector 35 is able to generate the detected signal S that includes the plurality of second pulses through sensing the encoded optical signal Sp.

In step S406, the input digital signal Si of the modulator 31 is restored by the decoder 36, according to the detected signal S having the plurality of second pulses. The decoder 36 is electrically connected to the optical detector 35, and the decoder 36 is utilized to receive the detected signal S generated by the optical detector 35. The decoder 36 restores the input digital signal Si of the modulator 31 according to the detected signal S having the plurality of second pulses. Furthermore, the decoder 36 is preferably a rising-edge-triggered decoder, every time the decoder 36 detects the rising edge of one of the plurality of second pulses, an output state of the decoder 36 is changed once. For example, assuming that a current output state of the decoder 36 is at a high level (1), when the decoder 36 detects the rising edge of a first of the plurality of second pulses, the output state is changed to be at a low level (0), and when the decoder 36 detects the rising edge of a second of the plurality of second pulses, the output state is changed to be at the high level. In other words, when the current output state of the decoder 36 is at the low level, and the decoder 36 detects the rising edge for the first time, the output state will be at the high level and will remain thereat; and when the decoder 36 detects the rising edge for the second time, the output state will change from the high level to the low level, and vice versa. Therefore, when the decoder 36 receives consecutive two of the plurality of second pulses, the decoder 36 generates an output pulse, and a pulse width of the output pulse is determined by the rising edge of the consecutive two of the plurality of second pulses and the time interval therebetween. An output digital signal So includes a plurality of output pulses. Since the pulse width of each of the plurality of first pulses are identical to one another, when the plurality of first pulses passes through an optical channel, the plurality of second pulses generated thereby have highly similar distortion or propagation delays with one another. Therefore, the output digital signal So can be guaranteed to accurately duplicate the input digital signal Si of the modulator 31.

Figure 6:
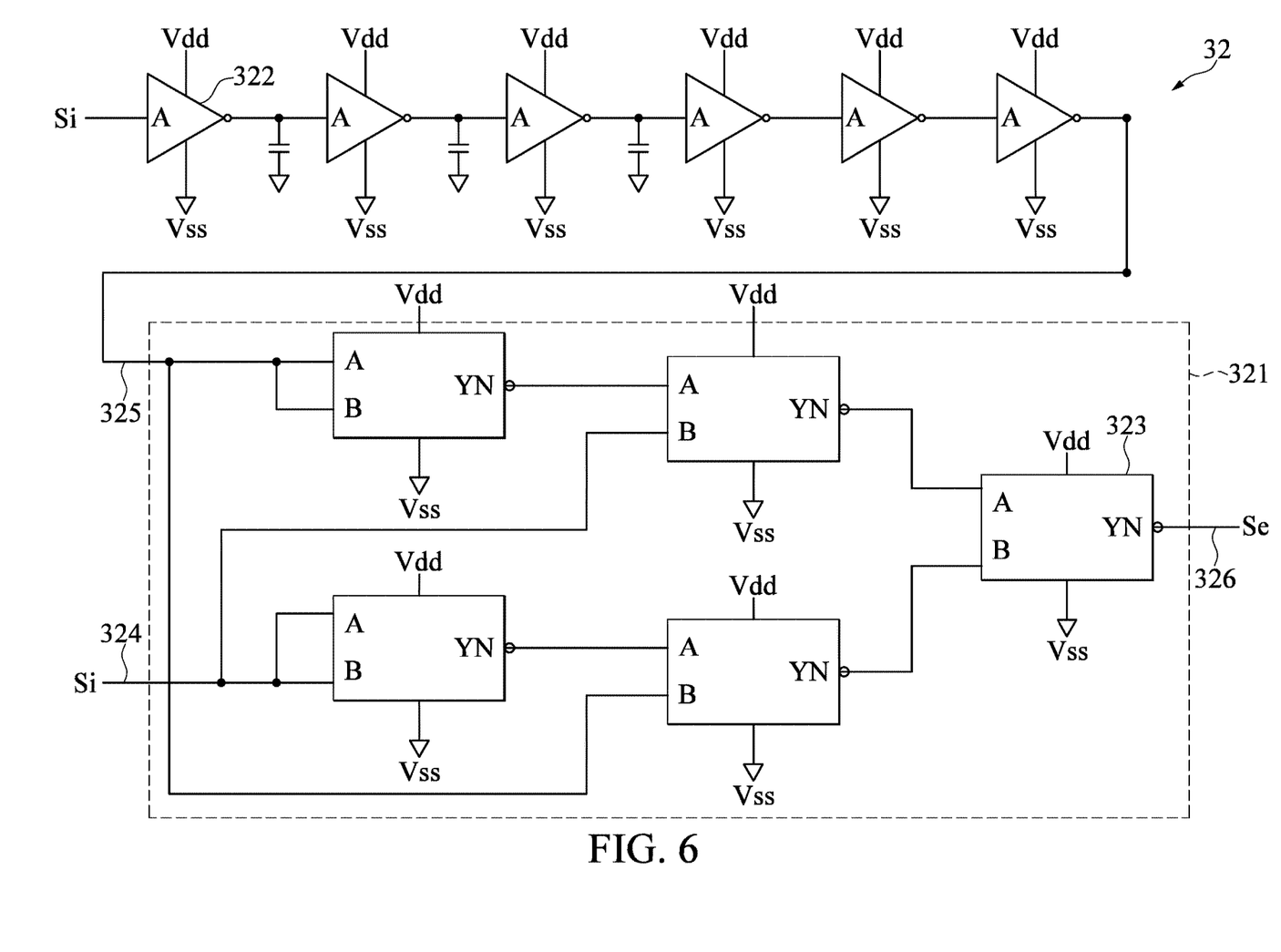
FIG. 6 is a schematic view showing a circuit of a decoder in an embodiment of the present disclosure.

Moreover, as shown in FIG. 6, in a preferable embodiment of the present disclosure, the encoder 32 can be composed of an XOR gate 321 and a plurality of delay units 322. The plurality of delay units 322 can delay the inputted signals for one fourth of the pulse width of the clock. The input digital signal Si of the modulator 31 is transmitted to an input port A of a first of the plurality of delay units 322 and a first input port 324 of the XOR gate 321 composed of five NAND gates 323. An output port YN of a last one of the plurality of delay units 322 is connected to a second input port 325 of the XOR gate 321, and the plurality of first pulses each having a predetermined pulse width are outputted from an output port 326 of the XOR gate 321. The plurality of first pulses that each have the predetermined pulse width are generated through the rising edge or the pulse falling edge of the input digital signal Si of the encoder 32 of the present disclosure. It is worth mentioning that the above-mentioned encoder 32 is composed of the XOR gate 321 and the plurality of delay units 322, but in other embodiments, the encoder 32 can be composed of other logic units, the present disclosure is not limited thereto; a person having ordinary skill in the art can design different encoders 32 that are composed of different logic units, which is not limited in the present disclosure. After the encoder 32 generates the plurality of first pulses that each have the predetermined pulse width, the encoder 32 generates the encoded signal Se having the plurality of first pulses.

Figure 7:
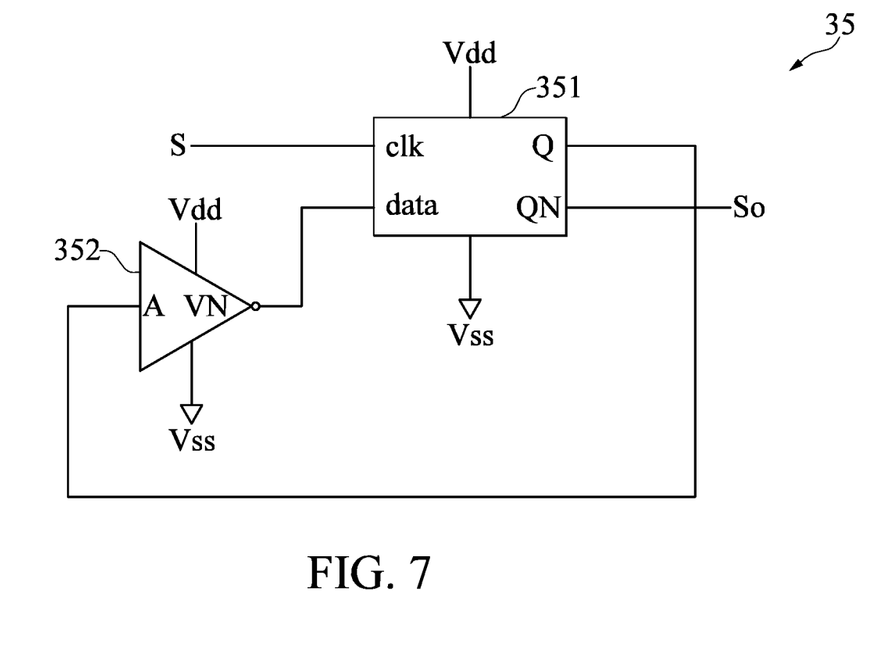
FIG. 7 is a schematic view showing a circuit of an encoder in the embodiment of the present disclosure.

Reference is made to FIG. 7, which is a schematic view showing a circuit of a decoder in the embodiment of the present disclosure. Furthermore, as shown in FIG. 7, the optical detector 35 can also be a dual-edge-triggered decoder that is composed of a flip-flop 351 that is D-edge-triggered and an inverter 352. The detected signal having the plurality of second pulses that each have the predetermined pulse width is transmitted to a clock input port clk of the flip-flop 351, the output port YN of the inverter 352 is electrically connected to a data input port data of the flip-flop 351, an input port A of the inverter 352 is connected to an output port Q of the flip-flop 351, and the output digital signal So is outputted from another output port QN of the flip-flop 351. A decoding circuit that is composed of the above-mentioned flip-flop 351 and the inverter 352 is able to decode the plurality of second pulses having the identical pulse width, so as to generate an output signal. It should be noted that, in a preferable embodiment, the dual-edge-triggered decoder is composed of one of the flip-flop 351 and one of the inverter 352, but in other embodiments, the dual-edge-triggered decoder can be composed of other logic units, which is not limited in the present disclosure.

Furthermore, the encoding and decoding method of the optical isolation amplifier of the present disclosure further includes a step of converting the output digital signal So into an output analog signal Sa through the digital-to-analog converter 37, and then filtering the noise in the output analog signal Sa through the low-pass filter 38. The digital-to-analog converter 37 is electrically connected to the decoder 36, the digital-to-analog converter 37 receives the output digital signal So of the decoder 36, and then converts the output digital signal So into the output analog signal Sa, so as to restore the original input analog signal Sia of the optical isolation amplifier 30. In a preferable embodiment of the present disclosure, the low-pass filter 38 can be utilized to filter the noise that is generated when the output digital signal So is converted into the output analog signal Sa, and eventually output the output analog signal Sa with less noise.

It can be observed from FIG. 5 that, in the optical isolation amplifier 30 of the present disclosure, the plurality of first pulses of the encoded signal Se, each having the predetermined pulse width, can be outputted through the encoder 32 when the input pulse rising edge or the input pulse falling edge of the input digital signal Si occurs, so as to accurately obtain a starting time and an ending time of a signal pulse of the input digital signal Si. Moreover, the plurality of first pulses of the encoded signal Se, each having the predetermined pulse width, would have experienced identical pulse distortion, rising edge, and pulse falling edge after passing through an optical channel. Furthermore, through a circuit design of the present disclosure, the plurality of second pulses each having the predetermined pulse width can completely duplicate the plurality of first pulses each having the predetermined pulse width. That is to say, even though propagation delay and distortion is to occur to the detected signal S after the detected signal S passes through the optical channel, after being decoded by the present disclosure, the output digital signal So can be accurately restored as the input digital signal Si. Therefore, the problems such as increased input offset voltage ($V_{os}$), decreased signal-to-noise ratio, and degradation of linearity of the optical isolation amplifier can be effectively improved.

One of the advantages of the method of the present disclosure is that the optical isolation amplifier is able to enhance the accuracy of the output signal of the optical isolation amplifier through the technical solution of adopting the dual-edge-triggered signal encoder and adopting the upper-edge-triggered signal decoder.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An encoding and decoding method for an optical isolation amplifier employing sigma-delta modulation technology, the optical isolation amplifier including an encoder, an optical driver, a light source, an optical detector, and a decoder, the encoding and decoding method comprising:
   the encoder generating an encoded signal having a plurality of first pulses, wherein, when an input digital signal presents an input pulse rising edge or an input pulse falling edge, each of the plurality of first pulses has a predetermined pulse width;
   outputting the encoded signal having the plurality of first pulses to the optical driver;
   driving the light source through the optical driver, according to the plurality of first pulses of the encoded signal, so as to output an encoded optical signal;
   generating a detected signal through the optical detector detecting the encoded optical signal, wherein the detected signal has a plurality of second pulses corresponding to the plurality of first pulses of the encoded signal; and
   duplicating the input digital signal of the encoder through the decoder according to the detected signal having the plurality of second pulses;
   wherein, after the encoded signal having the plurality of first pulses passes through the optical driver and the light source, the detector generates a plurality of distorted second pulses of the detected signal, and a distortion of each of the plurality of distorted second pulses is related to a pulse width of each of the plurality of first pulses.

2. The encoding and decoding method according to claim 1, wherein, before the step of generating the plurality of first pulses, the encoding and decoding method further comprises: converting an input analog signal to the input digital signal through a sigma-delta modulator.

3. The encoding and decoding method according to claim 2, wherein the predetermined pulse widths of the plurality of first pulses generated by the encoder are identical to one another, and the predetermined pulse width of each of the plurality of first pulses is between 10% and 25% of the pulse width of the clock of the sigma-delta modulator.

4. The encoding and decoding method according to claim 1, wherein the pulse width of each of the plurality of second pulses is equal to or substantially equal to that of each of the plurality of first pulses.

5. The encoding and decoding method according to claim 1, wherein the decoder is a rising-edge-triggered decoder, and when the decoder senses that one of the plurality of second pulses of the sensing signal is a rising edge, an output state of the decoder changes from a high level 1 to a low level 0, or changes from a low level 0 to a high level 1.

6. The encoding and decoding method according to claim 1, wherein, when the decoder receives two consecutive ones of the plurality of second pulses, the decoder generates an output pulse, and the pulse width of the output pulse is determined by rising edges of the two consecutive ones of the plurality of second pulses and a time interval therebetween.

7. The encoding and decoding method according to claim 6, further comprising: outputting an output digital signal having a plurality of the output pulses through the decoder.

8. The encoding and decoding method according to claim 7, further comprising: converting the output digital signal to an output analog signal through a digital-to-analog converter.

9. The encoding and decoding method according to claim 8, further comprising: filtering noises generated when converting the output digital signal to the output analog signal through a low-pass filter.

* * * * *